(12) United States Patent
Kato

(10) Patent No.: US 6,300,651 B1
(45) Date of Patent: Oct. 9, 2001

(54) CHIP LAYOUT FOR SYMMETRICAL-CRITICAL ELEMENTS

(75) Inventor: Tatsuhiro Kato, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/313,263

(22) Filed: May 18, 1999

(30) Foreign Application Priority Data

May 20, 1998 (JP) .................................. 10-155236

(51) Int. Cl.$^7$ .............................................. H01L 31/0328
(52) U.S. Cl. ..................... 257/207; 257/210; 257/211
(58) Field of Search .................... 257/207, 210, 257/211

(56) References Cited

U.S. PATENT DOCUMENTS

| | | | |
|---|---|---|---|
| 4,499,484 | * | 2/1985 | Tanizawa et al. ............ 357/68 |
| 5,109,265 | * | 4/1992 | Utesch et al. ................ 357/45 |
| 5,361,223 | * | 11/1994 | Inoue et al. ................. 365/51 |
| 5,619,472 | * | 4/1997 | Okamura ................. 365/230.03 |
| 5,898,636 | * | 4/1999 | Isomura et al. .......... 365/230.03 |
| 5,907,166 | * | 5/1999 | Casper et al. .............. 257/202 |
| 6,069,812 | * | 5/2000 | Lee et al. .................... 365/51 |

FOREIGN PATENT DOCUMENTS

| | | |
|---|---|---|
| 6-85185 | 3/1994 | (JP) . |
| 9-69294 | 3/1997 | (JP) . |
| 9-91978 | 4/1997 | (JP) . |
| 9-198882 | 7/1997 | (JP) . |
| 9-251785 | 9/1997 | (JP) . |
| 98-6287 | 3/1998 | (KR) . |
| WO96/24138 | 8/1996 | (WO) . |

OTHER PUBLICATIONS

Japanese Office Action dated Apr. 6, 1999, with partial translation.

\* cited by examiner

*Primary Examiner*—Fetsum Abraham
(74) *Attorney, Agent, or Firm*—McGinn & Gibb, PLLC

(57) ABSTRACT

A semiconductor device capable of making an interstitial space between adjacent two of pads and thereby decreasing a chip size without arising the difference of accessing speeds between banks. The semiconductor device has a center bonding structure including plural memory arrays (101 in FIG. 1), first peripheral circuit element groups (102 in FIG. 1) including amplifying circuit element, driving circuit element and the like which require to be arranged in symmetry relative to center bonding pads, second peripheral circuit element groups (103 in FIG. 1) including input/output circuit element, logic circuit element and the like which do not require the symmetrical arrangement, and pads (104 in FIG. 1). The second peripheral circuit element groups are essentially positioned on one side relative to the sequence of the pads.

13 Claims, 3 Drawing Sheets

CHIP LAYOUT FOR SYMMETRICAL-CRITICAL ELEMENTS

FIELD OF THE INVENTION

The present invention relates to a semiconductor device.

BACKGROUND OF THE INVENTION

In recent semiconductor memory devices, integration of memories becomes higher, and the area of pads occupied in a chip becomes increased. As to the arrangement of bonding pads, they are arranged on the periphery or in the center of a chip. Especially, in the latter case of a center bonding structure, longitudinal side length of the chip must be prolonged in order to arrange the pads due to the largeness of their number. On this account, it is necessary to reduce the number of wires each passing through an interstitial space between opposing pads and to shorten an interstitial distance between the pads.

A layout of a conventional semiconductor device will be explained below in reference to the accompanying drawings. FIGS. 3(a) through 3(c) are explanatory views showing a schematic layout of a conventional semiconductor device. FIG. 3(a) is a layout view showing the peripheral part of bonding pads of a center bonding structure; FIG. 3(b), a layout view showing a wire connection part of FIG. 3(a); and FIG. 3(c), an explanatory view showing a layout of another center bonding structure.

As shown in FIGS. 3(c) through 3(c) shelves 103 for arranging second peripheral circuit elements including input/output circuit element, internal voltage-dropping circuit element, logic circuit element and the like are positioned on a chip of a center bonding structure so as to sandwich bonding pads 104. A self 102 for arranging first peripheral circuit elements such as data-amplifying circuit element, word line driving circuit element and the like is positioned outside each of the shelves 103. Further, memory arrays 101 are positioned outside the shelves 102, respectively. Wires for transmitting electric signals are formed between the shelves 102 for arranging first peripheral circuit elements or between the shelves 103 for arranging second peripheral circuit elements. The shelves 102 are positioned along both sides of the pads.

SUMMARY OF THE DISCLOSURE

However, in the course of the investigations toward the present invention the following problems have been encountered. Namely, in such a structure as disclosed above wherein the bonding pads are centered and the shelves 102 and 103 are positioned on both sides thereof, it may be possible to reduce the difference in data-accessing speeds between banks. However, this layout causes a problem that an increase cannot be avoided in the number of wires each passing through an interstitial space between two of the pads 104 correspondingly to the number of connection wires 108 each of which connects two shelves 103 which are disposed opposing each other through the intermediary of the pads.

In order to decrease the number of the wires each passing through the interstitial space, it is necessary to position longitudinal wires 106 at both sides of the pads 104 as shown in FIG. 3(c). This structure causes a problem that the width or distance along the transverse direction (up and down direction in the figure) of a chip should be increased, which results in increasing the chip size.

The present invention has been made in consideration of the above problems. An essential object of the present invention is to provide a semiconductor device capable of making the interstitial space between two of the pads 104 narrow and thereby decreasing the chip size without increasing the difference in accessing speeds between banks.

A semiconductor device of the present invention comprises a sequence of pads, memory arrays positioned along both sides thereof and peripheral circuit element groups positioned between the memory arrays. The semiconductor device is improved in that the peripheral circuit element groups which do not affect circuit operation are positioned on one side of the sequence of pads so as to reduce the number of wires connected to the peripheral circuit element groups passing through an interstitial area between adjacent two of the pads.

The present invention also provides a semiconductor device comprising a sequence of pads, memory arrays positioned along both sides thereof, and first and second peripheral circuit element groups each positioned between the memory arrays. The first peripheral circuit element groups include circuit elements which require to be positioned in symmetry relative to the sequence of the pads from the view of circuit properties. In contrast to this, each of the second peripheral circuit element groups includes circuit elements which do not require to be positioned in symmetry relative to the sequence of the pad from the view of circuit properties. The semiconductor device of the present invention is improved in that the second peripheral circuit element groups are positioned so that wires each connected to two of the second peripheral circuit element groups do not pass through an interstitial area between neighboring two of the pads. The second peripheral circuit element groups may be positioned on one side of the sequence of the pads.

The first peripheral circuit element groups preferably include amplifying circuit element and driving circuit element or other circuits having the equivalent function of these circuit elements, and the second peripheral circuit element groups preferably include input/output circuit element and logic circuit, or other circuits having the equivalent function of these circuit elements.

PREFERRED EMBODIMENTS OF THE INVENTION

Figure 1A:
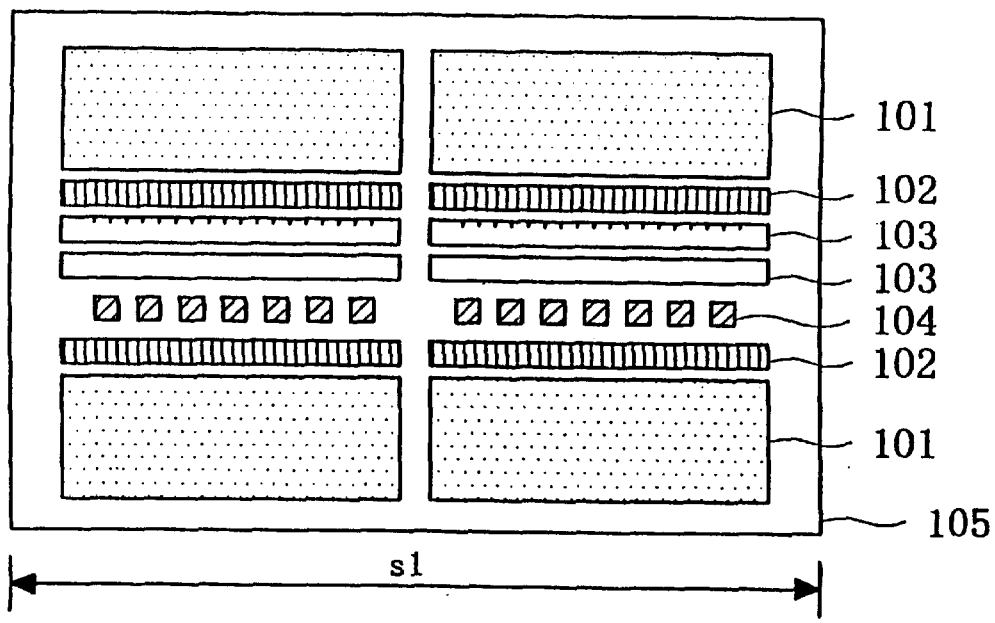
FIGS. 1(a) and 1(b) are layout views for use in explaining a first exemplary semiconductor device of the present invention.
Figure 1B:
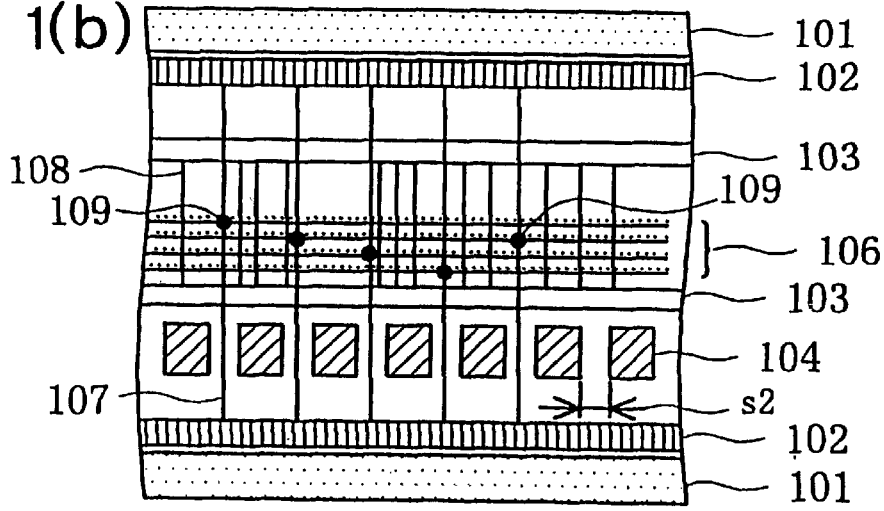

According to one of the preferred embodiments of the present invention, there is provided a semiconductor device that has a center bonding structure including on a chip plural memory arrays (101 in FIGS. 1(a) and 1(b)), first peripheral circuit element groups (102 in FIG. 1) including amplifying circuit element, driving circuit element and the like which require to be arranged in symmetry relative to center bonding pads, second peripheral circuit element groups (103 in FIGS. 1(a) and 1(b)) including input/output circuit element, logic circuit element and the like which do not require the above symmetrical arrangement, and pads (104 in FIGS. 1(a) and 1(b)). In the above semiconductor device of the present invention, the second peripheral circuit element groups are essentially positioned on one side of the sequence of the pads.

EXAMPLES

Examples of the present invention will be explained below in reference to the accompanying drawings in order to explain to the embodiments of the present invention in more detail.

Example 1

FIGS. 1(a) and 1(b) is an explanatory view showing a layout of an exemplary semiconductor device of the present invention which is to be explained in the following Example 1. FIG. 1(a) is a layout view for use in explaining the arrangement of pads, peripheral circuit elements and memory arrays; and FIG. 1(b), a layout view for use in explaining connection wires arranged interstitially between peripheral elements.

Referring to FIGS. 1(a) and 1(b) memory array areas 101 which occupy a large part of a chip area 105 are placed on the periphery of the chip area 105. On the center of the chip intermediate between the memory array areas 101, there are positioned (pair of) shelves 102 for arranging first peripheral circuit elements including data-amplifying circuit element, word line driving circuit element and the like, shelves 103 for arranging second peripheral circuit elements including input/output circuit element, internal voltage-dropping circuit element, logic circuit and the like, and pads 104.

Here, the shelves 102 for arranging the first peripheral circuit elements including data-amplifying circuit elements, word line driving circuit elements and the like are positioned inside each of the memory array areas 101. 2 lines of the shelves 103 for arranging the second peripheral circuit elements including input/output circuit elements, internal voltage-dropping circuit elements, logic circuits and the like are arranged inside one of the shelves 102 (upper side of the chip found in FIGS. 1(a) and 1(b)) for arranging the first peripheral circuit elements. The pads 104 are positioned inside another one of the shelves 102 (lower side of the chip found in FIGS. 1(a) and 1(b)) for arranging the first peripheral circuit elements.

At this time, the pads 104 are not positioned at the center of the chip in layout. In this addition, the shelves 103 for arranging the second peripheral circuit elements are not symmetrical relative to the sequence of the pads 104. However, circuit elements requiring the symmetry for their circuit properties are not positioned in the shelves 103 for arranging the second peripheral circuit elements but positioned in the shelves 102 for arranging the first peripheral circuit elements. Accordingly, there is no fear of increasing the difference in the accessing speed between banks.

The above constitution makes a pair of the shelves 103 (illustrated up and down in FIGS. 1(a) and 1(b)) for arranging the second peripheral circuit elements arranged at one side of the chip relative to the sequence of the pads 104. Consequently, connection wires 108 each connecting the two (illustrated up and down in FIGS. 1(a) and 1(b)) of the shelves 103 for arranging the second peripheral circuit elements to each other never pass through the interstitial space between adjacent two of the pads 104. Accordingly, the number of connection wires each passing through the interstitial space between the two of the pads 104, and thereby, the distance s2 between the two of the pads 104 can be decreased.

Explaining more concretely, connection wires 107 each connecting a longitudinal wire 106 and the shelves 102 for arranging the first peripheral circuit elements mainly include data bus and address wire. The number of the connection wires 107 is usually about 4 to 5. In contrast to this, the number of connection wires 108 each connecting the two (illustrated up and down in FIGS. 1(a) and 1(b)) of the shelves 103 for arranging the second peripheral circuit elements to each other is larger than that of the connection wires 107, since the shelves 103 require to includes input/output circuits, internal voltage-dropping circuit elements and other logic circuit elements placed therein.

In this example, connection wires each passing through the interstitial space between the adjacent two of the pads 104 only consist of the connection wires 107 the number of which is small. Consequently, the distance s2 between the two of the pads 104 can be decreased. Accordingly, the longitudinal side length sl of the chip, or the chip size can be reduced in a semiconductor device in which the sequence of the pads 104 dominates the chip size.

Example 2

Figure 2:
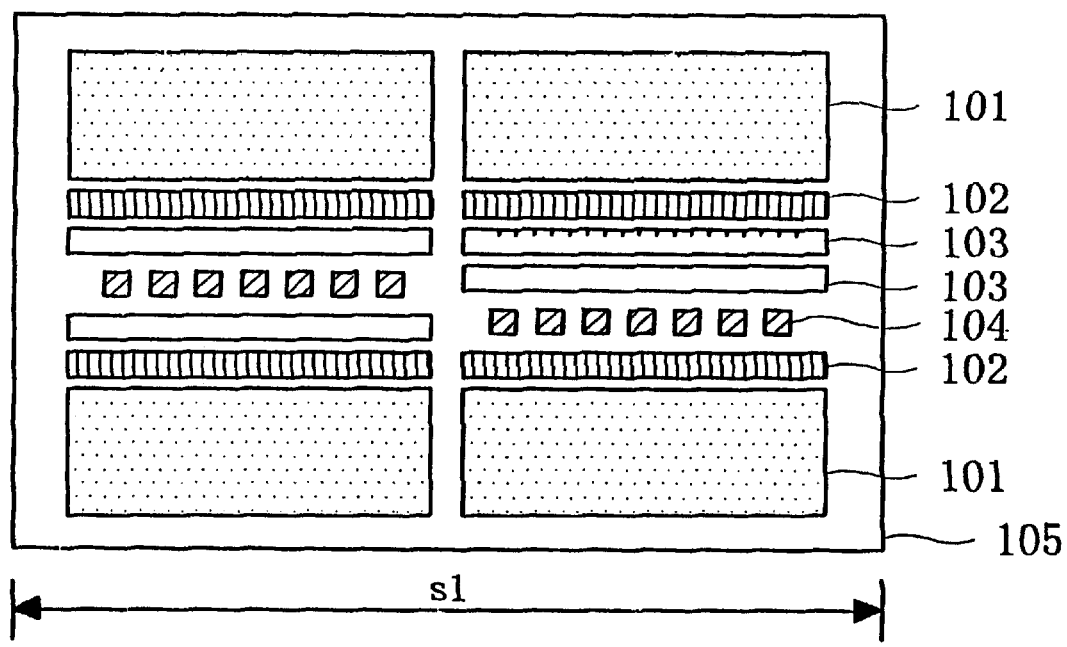
FIG. 2 is a layout view for use in explaining a first exemplary semiconductor device of the present invention.
Figure 3A:
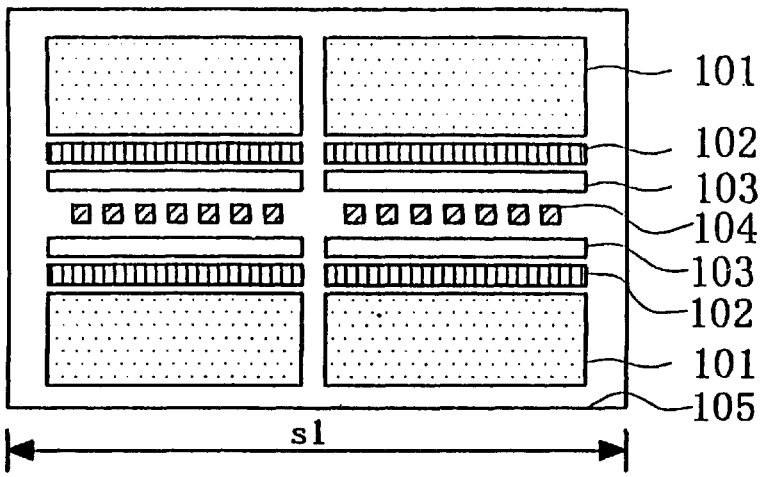
FIGS. 3(a) through 3(c) show layout views showing the periphery of bonding pads found in a conventional semiconductor device.
Figure 3B:
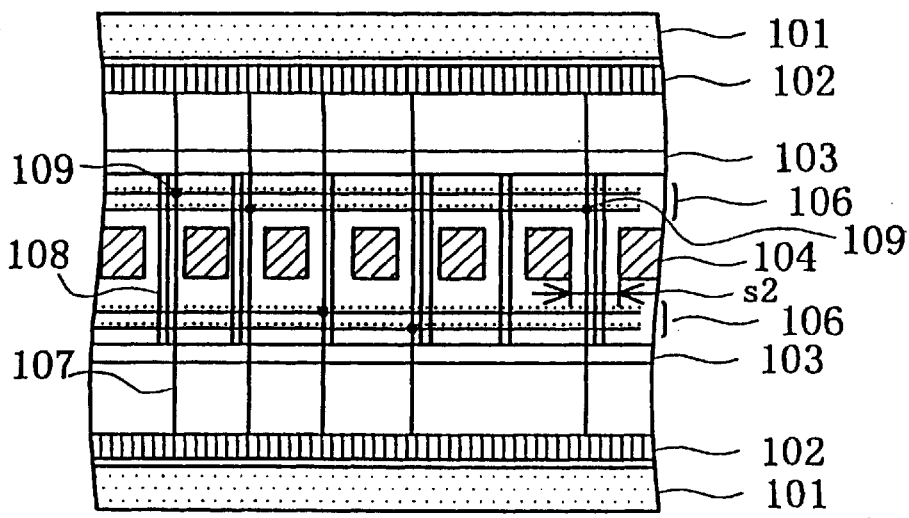
Figure 3C:
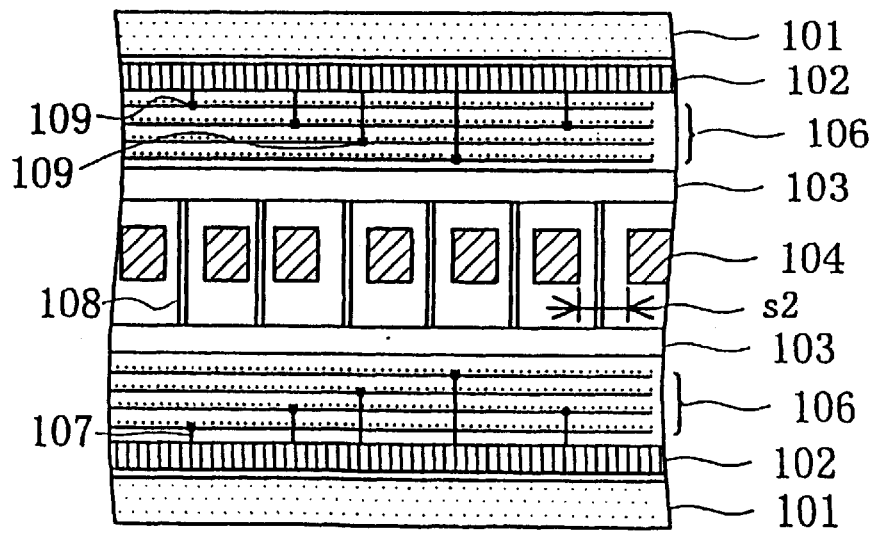

Next, Example 2 of the present invention will be explained below in reference to the accompanying drawings. FIG. 2 is an explanatory view showing a layout of another exemplary semiconductor device of the present invention which is to be explained in the following Example 2.

Referring to FIG. 2, memory array areas 101 which occupy a large part of a chip area 105 are placed on the peripheries of the chip area 105. On the center of the chip intermediate between memory array areas, there are positioned shelves 102 for arranging first peripheral circuit elements including data-amplifying circuit elements, word line driving circuit elements and the like, shelves 103 for arranging second peripheral circuit elements including input/output circuit elements, internal voltage-dropping circuit elements, logic circuits and the like, and pads 104.

In this example, the arrangement of the shelves 103 for arranging the second peripheral circuit elements which do not require the symmetrical arrangement in connection with circuit properties is changed depending on the number of wires connecting the shelves 102 for arranging the first peripheral circuit elements to each other and the number of wires connecting the shelves 103 for arranging the second peripheral circuit elements to each other. In case that the numbers of these wires are large, the shelves 103 are distributed on one side of the chip area 105. In contrast to this, in case where a chip has the space enough to increase the number of the pads with respect to its layout, a layout is employed that the shelves 103 are distributed so that the pads 104 are positioned at the center of the shelves 103.

The meritorious effects of the invention are summarized as follows.

As explained in the above, the present invention provides an effect that a chip size can be reduced without arising the difference in the data-accessing speed between banksin connection with memory arrays positioned on the peripheries at the both sides of a chip by distributing a pair of shelves for arranging second peripheral circuit elements including at least one of input/output circuit elements, internal voltage-dropping circuit elements, logic circuits and the like which do not require to be disposed symmetrically in view of the circuit properties on one side of the chip relative to the pads.

This reason is explained as follows. Connection wires each connecting a longitudinal wire and shelves for arranging the first peripheral circuit elements mainly include data bus and address wires. Thus the number of the connection wires is small. In contrast to this, the number of connection wires connecting two separated shelves for arranging the second peripheral circuit elements to each other is large, since the shelves require to include input/output circuits, internal voltage-dropping circuit elements and other logic circuit elements to be placed therein.

According to the present invention, the shelves for arranging the second peripheral circuit elements can be positioned on one side of the chip relative to the pads. In this case, each of the connection wires connecting a pair of the shelves for arranging the second peripheral circuit elements, the number of which is large, does not pass through an interstitial space between adjacent two pads consequently, the distance between the two pads can be shortened. Accordingly, the longitudinal side length of the chip, or the chip size can be decreased.

According to the conventional center bonding structure, the sequence (array) of pads is located at the center, which necessitates a number of connecting wires to be passed between adjacent pads. In case where the peripheral circuit element groups are disposed over the both sides of the pad sequence, the number of connecting wires between the peripheral circuit element groups will inevitably increase to a large extent (conventionally, about 200 wires or so). In contrast, the one side disposition, relative to the pad sequence, of the peripheral circuit element groups which do no affect the circuit operation, the number of wires connecting therebetween is significantly reduced (e.g., an order of about 50).

For instance, the longitudinal layout size can be reduced as follows according to the present invention.

Conventional:(pad number×pad pitch)+(200 wires*× wiring pitch)

Inventive: (pad number×pad pitch)+(50 wires*×wiring pitch)

Reduction effect: 150(reduction in wires)×wiring pitch

N.B. *Wires passing through between adjacent pads.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A semiconductor device comprising:
    a sequence of pads;
    memory arrays positioned along both sides thereof; and
    peripheral circuit element groups positioned between the memory arrays,
    wherein said peripheral circuit element groups having no affect on symmetrical circuit operation are positioned on only one side of the sequence of pads to reduce the number of wires passing through an interstitial area between adjacent two of the pads.

2. The semiconductor device as defined in claim 1, wherein said peripheral circuit element groups are positioned in shelves which are disposed on one side of said pads.

3. The semiconductor device as defined in claim 2, wherein said shelves of the peripheral circuit element groups disposed on one side of said pads do not require symmetry about said pads.

4. The semiconductor device as defined in claim 3, wherein said peripheral circuit element groups comprise further shelves of the peripheral circuit element groups which are disposed on both sides of said pads.

5. The semiconductor device as defined in claim 4 wherein said further shelves of the peripheral circuit element groups disposed on both sides of the pads are connected together via wires each passing through an interstitial area of neighboring two of said pads.

6. The semiconductor device as defined in claim 3 wherein longitudinal wires are disposed between and along said shelves of said peripheral circuit element groups disposed on one side of the pads.

7. The semiconductor device as defined in claim 6, wherein any one of said longitudinal wires is connected with a wire connecting two shelves of said peripheral circuit element groups disposed on both sides of the pads passing through between neighboring two of said pads.

8. A semiconductor device comprising:
    arrayed pads;
    memory arrays positioned along both sides thereof; and
    first and second peripheral circuit element groups, each positioned between said memory arrays
    wherein said first peripheral circuit element groups comprise circuit elements which require being positioned in symmetry relative to said arrayed pads in view of circuit properties,
    wherein said second peripheral circuit element groups comprise circuit elements which do not require being positioned in symmetry relative to said arrayed pads in view of circuit properties, and
    wherein said second peripheral circuit element groups are positioned so that wires each connected to two of said second peripheral circuit element groups do not pass through an area interstitial between two of said pads.

9. A semiconductor device as defined in claim 8,
    wherein said first peripheral circuit element groups comprise an amplifying circuit element and a driving circuit element, or other circuits having the equivalent function of these circuit elements, and
    wherein said second peripheral circuit element group or groups comprise an input/output circuit element and a logic circuit, or other circuits having the equivalent function of these circuit elements.

10. A semiconductor device comprising:
    a sequence of pads;
    memory arrays positioned along both sides thereof; and
    first and second peripheral circuit element groups each positioned between said memory arrays,
    wherein each of said first peripheral circuit element groups comprises circuit elements which require being positioned in symmetry relative to the sequence of said pads in view of circuit properties,
    wherein each of said second peripheral circuit groups comprises circuit elements which do not require being positioned in symmetry relative to the sequence of said pads in view of circuit properties, and
    wherein all of said second peripheral circuit groups are positioned on only one side relative to said sequence of the pads.

11. The semiconductor device as defined in claim 10,
    wherein said first peripheral circuit element groups comprise an amplifying circuit element and a driving circuit element, or other circuits having the equivalent function of these circuit elements, and
    wherein said second peripheral circuit element group or groups comprise an input/output circuit element and a logic circuit, or other circuits having the equivalent function of these circuit elements.

12. A semiconductor device comprising:

a plurality of bonding pads arranged in a sequence; and two groups of circuit elements comprising a first group of circuit elements that affect symmetrical circuit operation and a second group of circuit elements that do not affect symmetrical circuit operation, wherein essentially all circuit elements of said second group are located on a same side relative to said sequence of pads.

13. A semiconductor device comprising:

a plurality of bonding pads; and two groups of peripheral circuit elements comprising a first group of circuit elements that affect symmetrical circuit operation and a second group of circuit elements that do not affect symmetrical circuit operation, wherein said second group is positioned so that wires each connected to two of said second peripheral circuit element group do not pass through an area interstitial between two of said pads.

* * * * *